United States Patent [19]

Knauer et al.

[11] 4,193,050

[45] Mar. 11, 1980

[54] TRANSVERSAL FILTER

[75] Inventors: Karl Knauer, Gauting; Hans J. Pfleiderer, Zorneding, both of Fed. Rep. of Germany

[73] Assignee: Siemens Aktiengesellschaft, Berlin & Munich, Fed. Rep. of Germany

[21] Appl. No.: 872,161

[22] Filed: Jan. 25, 1978

[51] Int. Cl.[2] .............. H03H 7/28; H03K 5/159; G11C 19/18; G11C 27/00
[52] U.S. Cl. .................. 333/165; 307/221 D; 333/166; 364/862
[58] Field of Search ............ 357/24; 333/70 R, 70 T, 333/70 A, 29, 18, 28 R, 165, 166; 307/221 C, 221 R, 221 D; 328/167, 60, 61; 364/724, 824–826, 862, 725

[56] References Cited

U.S. PATENT DOCUMENTS

| | | | |
|---|---|---|---|
| 3,809,923 | 5/1974 | Esser | 307/221 R X |
| 3,935,439 | 1/1976 | Buss et al. | 357/24 X |
| 3,952,188 | 4/1976 | Sloate et al. | 333/18 X |
| 4,100,513 | 7/1978 | Weckler | 333/70 T |

OTHER PUBLICATIONS

Ibrahim et al., "Multiple Filter Characteristics Using a Single CCD Structure," Proc. 1975 International Conference on the Application of Charge Coupled Devices, Oct. 29–31, 1975, pp. 245–249.

Buss et al., "Transversal Filtering Using Charge Transfer Devices" in IEEE Journal of Solid State Circuits, vol. SC8, No. 2, Apr. 1973, pp. 138–146.

*Primary Examiner*—Paul L. Gensler
*Assistant Examiner*—Marvin Nussbaum
*Attorney, Agent, or Firm*—Hill, Van Santen, Steadman, Chiara & Simpson

[57] ABSTRACT

A transversal filter with a charge shift device is disclosed for realizing a given filter function. The charge shift device includes a substrate of doped semiconductor material having arranged on one surface thereof a series of shift elements, each shift element having a plurality of capacitor elements in correspondence to the number of shift pulse sequence lines employed with the charge shift device. A serial input is provided for the filter to which an input signal is connected. Capacitor elements connected to one of the shift pulse sequence lines have non-reactive amplifying output units connected thereto. At least one of the capacitor elements connected to at least one of the other shift pulse sequence lines has an additional non-reactive amplifying unit connected thereto. All of the non-reactive amplifying units also connect with an output of the filter.

2 Claims, 9 Drawing Figures

|  | $K_{11}s_{11}$ | $K_{11}s_{12}$ | $K_{11}s_{21}$ | $K_{11}s_{22}$ | $K_{11}s_{31}$ | $K_{11}s_{32}$ | $K_{11}s_{41}$ | $K_{11}s_{42}$ | $K_{11}s_{51}$ | $K_{11}s_{52}$ | $K_{11}s_{61}$ |
|---|---|---|---|---|---|---|---|---|---|---|---|
| 11 | $K_{12}s_{11}$ | $K_{12}s_{12}$ | $K_{12}s_{21}$ | $K_{12}s_{22}$ | $K_{12}s_{31}$ | $K_{12}s_{32}$ | $K_{12}s_{41}$ | $K_{12}s_{42}$ | $K_{12}s_{51}$ | $K_{12}s_{52}$ | $K_{12}s_{61}$ |
| 12 | $K_{21}s_{11}$ | $K_{21}s_{12}$ | $K_{21}s_{21}$ | $K_{21}s_{22}$ | $K_{21}s_{31}$ | $K_{21}s_{32}$ | $K_{21}s_{41}$ | $K_{21}s_{42}$ | $K_{21}s_{51}$ | $K_{21}s_{52}$ | $K_{21}s_{61}$ |
| 21 | $K_{22}s_{11}$ | $K_{22}s_{12}$ | $K_{22}s_{21}$ | $K_{22}s_{22}$ | $K_{22}s_{31}$ | $K_{22}s_{32}$ | $K_{22}s_{41}$ | $K_{22}s_{42}$ | $K_{22}s_{51}$ | $K_{22}s_{52}$ | $K_{22}s_{61}$ |
| 22 | $K_{31}s_{11}$ | $K_{31}s_{12}$ | $K_{31}s_{21}$ | $K_{31}s_{22}$ | $K_{31}s_{31}$ | $K_{31}s_{32}$ | $K_{31}s_{41}$ | $K_{31}s_{42}$ | $K_{31}s_{51}$ | $K_{31}s_{52}$ | $K_{31}s_{61}$ |
|  | $K_{32}s_{11}$ | $K_{32}s_{12}$ | $K_{32}s_{21}$ | $K_{32}s_{22}$ | $K_{32}s_{31}$ | $K_{32}s_{32}$ | $K_{32}s_{41}$ | $K_{32}s_{42}$ | $K_{32}s_{51}$ | $K_{32}s_{52}$ | $K_{32}s_{61}$ |
|  | $K_{41}s_{11}$ | $K_{41}s_{12}$ | $K_{41}s_{21}$ | $K_{41}s_{22}$ | $K_{41}s_{31}$ | $K_{41}s_{32}$ | $K_{41}s_{41}$ | $K_{41}s_{42}$ | $K_{41}s_{51}$ | $K_{41}s_{52}$ | $K_{41}s_{61}$ |
|  | $K_{42}s_{11}$ | $K_{42}s_{12}$ | $K_{42}s_{21}$ | $K_{42}s_{22}$ | $K_{42}s_{31}$ | $K_{42}s_{32}$ | $K_{42}s_{41}$ | $K_{42}s_{42}$ | $K_{42}s_{51}$ | $K_{42}s_{52}$ | $K_{42}s_{61}$ |

Diagonals labeled A1, A2, A3.

TRANSVERSAL FILTER

BACKGROUND OF THE INVENTION

The present invention relates to a transversal filter comprising a charge shift device, wherein, on one surface of a substrate consisting of doped semiconductor material there is arranged a series of capacitor elements, each consisting of at least one insulating layer capacitor. For the operation of the filter, the outer or surface electrodes of each capacitor element are connected to one of a number of (at least two) shift pulse sequences which are displaced in phase relative to one another. The filter has a serial input to which the signal to be filtered is applied. In the case of capacitor elements intended for a selected member of the shift pulse trains, non-reactive amplifying outputs are provided which are connected to a filter output from which the signal to be filtered can be obtained. The amplification factor of each of these amplifying outputs corresponds to an assigned value of the pulse response of the filter function provided by the filter.

Transversal filters of the type described above are known (IEEE Journal of Solid-State Circuits, Vol. SC-8, No. 2, April 1973, pages 138 to 146 and Bell-Northern Research 11.4, pages 240 to 243). The charge shift devices consist of CCDs. The non-reactive, amplifying outputs can be achieved either by means of the so-called split-electrode method or by means of true amplifiers having high-ohmic input impedances. In the case of the split-electrode method, each relevant capacitor element consists of two insulating layer capacitors which are arranged next to one another and are coupled by means of a doped zone in the substrate. The capacitance ratio of these two insulating layer capacitors is selected in dependence upon the desired amplification factor. The non-reactive, amplifying outputs are provided only in the case of specific capacitor elements, and in fact only in those intended for one and the same predetermined shift pulse sequence. All the other non-reactive, amplifying outputs are connected to a filter output from which the filtered signal can be obtained. The amplification factor of each non-reactive amplifying output corresponds to an assigned value of the pulse response of the filter function which is to be provided by the filter.

SUMMARY OF THE INVENTION

An object of the present invention is to provide a transversal filter of the type described above which is able to provide different additional filter properties as compared to a corresponding transversal filter of the conventional type which provides the same filter function.

The object is realized in that for at least one of the other capacitor elements there is provided at least one non-reactive, amplifying output which is connected to a filter output. Preferably the amplification factor of this output likewise corresponds to an assigned value of the pulse response of the filter function.

The fundamental advantages of the invention are as follows. With a predetermined, arbitrary filter function, in comparison to corresponding transversal filters of conventional type, it is possible to considerably reduce the surface space requirement and also, if the same surface space is retained, it is possible to considerably increase the reproduction accuracy of the filter function by means of additional, non-reactive, amplifying outputs. Furthermore, different filter properties can additionally be achieved simply by modifying the shift pulse train frequencies during operation.

DESCRIPTION OF THE PREFERRED EMBODIMENTS

Figure 1:
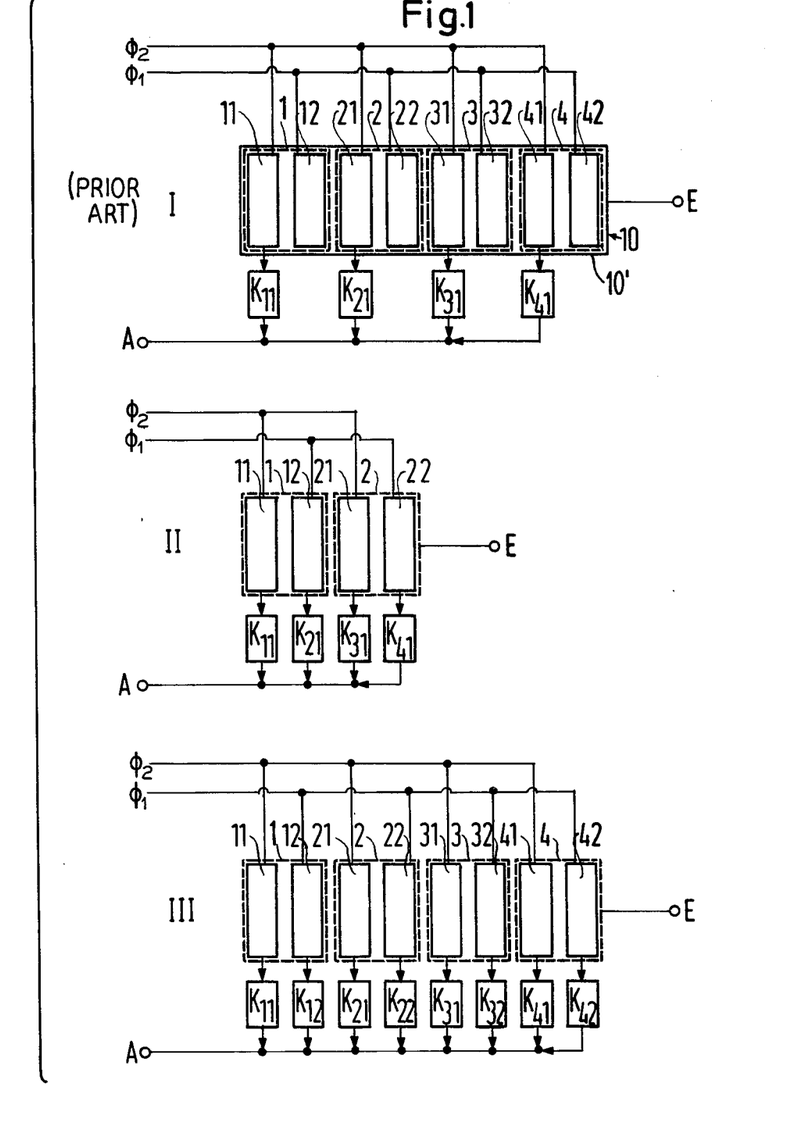
FIG. 1 schematically illustrates a conventional transversal filter I in comparison to two exemplary embodiments II and III of the invention, which have likewise been shown schematically.

In FIG. 1, the conventional transversal filter is referenced I. The charge shift device illustrated at 10 consists of a CCD for two-phase operation. This means that each shift element of this CCD consists of two adjacent capacitors each formed of a surface electrode and the substrate 10' with an insulating layer thereon. These shift elements are individually illustrated by the dashed line rectangles with the reference numerals 1 to 4. The capacitor surface electrodes or elements themselves are individually provided with the references 11, 12, 21, 22, 31, 32, 41 and 42. The capacitor electrodes 11, 21, 31 and 41 are intended for the one, and the other capacitor electrodes for the other of the two shift pulse sequences $\phi_1$ and $\phi_2$ which are displaced in phase relative to one another. The serial input of the CCD is symbolically represented and referenced E. In the case of each capacitor electrode which is intended for a shift pulse sequence, there is provided a non-reactive, amplifying output $K_{11}$, $K_{21}$, $K_{31}$ and $K_{41}$. All the outputs are connected to a filter output A. In FIG. 1, I, the outputs are provided in the capacitor electrodes 11, 21, 31 and 41. In place of these capacitor electrodes, such outputs could equally well be provided in the capacitor elements 12, 22, 32 and 42. The symbols $K_{11}$, $K_{21}$, $K_{31}$ and $K_{41}$ are to simultaneously represent the amplification factors of the relevant, non-reactive, amplifying outputs. The CCD 10 can generally be a CCD for n phase operation, where n=2, 3, 4, 5 . . . . Each element of the CCD then contains n adjacent capacitor electrodes, and n shift pulse sequences displaced in phase relative to one another must therefore be connected for operation. Each possibility is suitable for the non-reactive, amplifying outputs.

In the exemplary embodiments II and III in FIG. 1, in each capacitor element of the charge shift device there is provided a non-reactive, amplifying output, each of which is connected to a common filter output A. In the two exemplary embodiments, the same non-reactive, amplifying outputs $K_{11}$, $K_{21}$, $K_{31}$ and $K_{41}$ as in I have been employed. In the case of filter II, as with I, only these outputs are employed. If II is compared with I, it will be seen that in II only four capacitor electrodes 11, 12, 21, and 22 are required. Everything else remains the same. Thus with II a surface space reduction of approximately 50% is achieved in comparison to I. When a CCD for n phase operation ($n=2, 3, 4, 5 \ldots$) is used, the surface space requirements of II can be reduced by the factor $1/n$ in comparison to I.

The filter III differs from the filter I in that in the case of the capacitor electrodes 12, 22, 32 and 42, additional non-reactive amplifying outputs $K_{12}$, $K_{22}$, $K_{32}$ and $K_{42}$, are provided which are connected to the filter output A. Thus with III, double the number of non-reactive, amplifying outputs are provided as with filter I. When a charge shift device for n phase operation ($n=2, 3, 4, 5 \ldots$) is used, up to n times as many outputs can be provided in a filter III as in a filter I.

Figure 9:
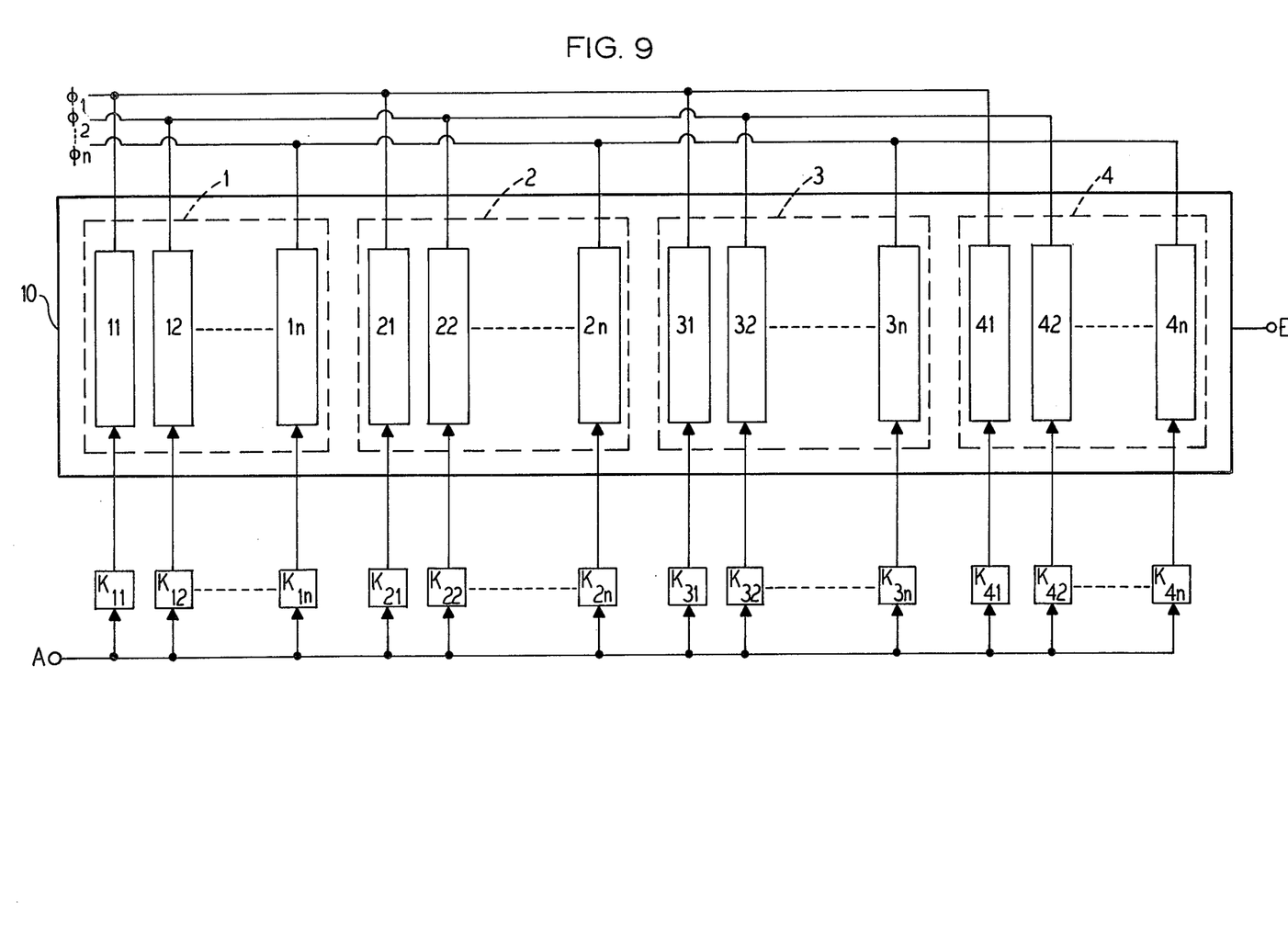
FIG. 9 shows a CCD of the invention with n phases.

This is shown in FIG. 9 for a CCD where $1n$, $2n$, $3n$, and $4n$ show the nth capacitor electrodes and $K1n$, $K2n$, $K3n$, and $K4n$ the nth amplifying outputs.

The method in which the pulse train frequency of the shift pulse train for the charge shift device in filters II and III is selected is of fundamental significance. Two situations are of particular significance: on the one hand the pulse train frequency is selected to compare with the pulse train frequency $f_0$ for the filter I, resulting in a doubling of the output frequency with which the filtered signal incoming at the filter output A is emitted (when a charge shift device for n phase operation is used it can be increased n times), or else the pulse train frequency of the shift pulse train is selected to be equal to $f_0/2$ (generally $f_0/n$), whereby the output frequency with which the filtered signal arrives at the output A is equal to $f_0$. The output frequency at the output A is in any case double (generally n times) the sampling frequency with which the signal to be filtered is sampled at the input E.

Thus a total of four such cases can be differentiated for the filters II and III in FIG. 1. If the pulse train frequency of the shift pulse train for the filter I in FIG. 1 is referenced as above $f_0$, that for filter II is referenced $f_{II}$, and that for filter III is referenced $f_{III}$, these situations can be differentiated as follows: $f_{II}=f_0$, $f_{III}=f_0$, $f_{II}=f_0/n$ and $f_{III}=f_0/n$. In the special case of the exemplary embodiments, $n=2$. The shift pulse train is to be understood as the pulse train with which an information charge is forwarded from element to element of the charge shift device.

Figure 2:
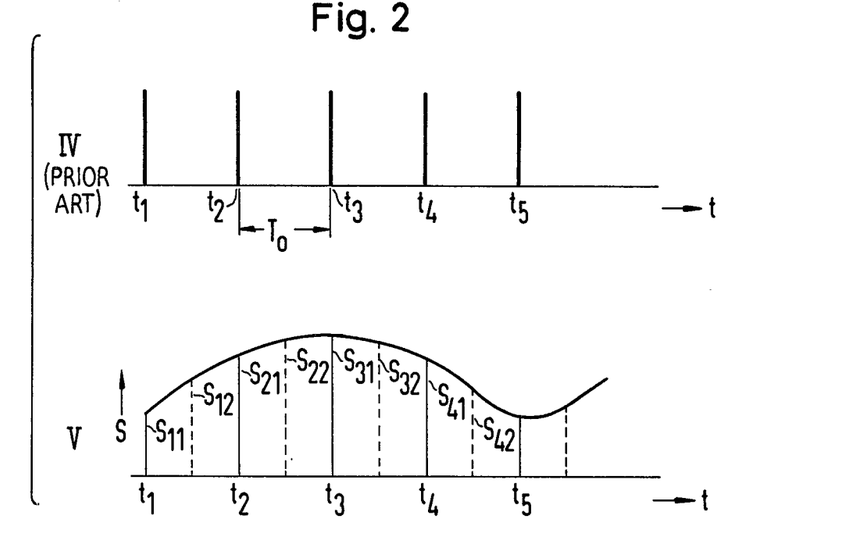
FIG. 2 illustrates in diagram IV shift pulse trains plotted over time t, and beneath in a diagram V, the time curve of an arbitrarily selected signal which is to be filtered.

FIG. 2, which shows two diagrams IV and V, provides further explanation. In diagram IV, over the time t the pulse train sequence of the shift pulse train for the charge shift device 10 is schematically represented by lines. The pulse train duration is referenced $T_0$. Beneath, in diagram V, an arbitrarily selected form of a signal to be filtered is represented over the time t. The pulse train frequency of the shift pulse train is governed by $f_0-1/T_0$. The signal to be filtered is sampled in filter I with the pulse train frequency $f_0$. The sampled signal values are referenced $S_{11}$, $S_{21}$, $S_{31}$ and $S_{41}$. If the filter I were operated with the pulse train frequency $2f_0$, additional signal values would be sampled. These additional signal values are likewise entered in FIG. 2 and referenced $S_{12}$, $S_{22}$, $S_{32}$ and $S_{42}$. However, these additional signal values are of no significance in the following.

In the filter I, the capacitor elements or electrodes are provided with two-digit references xy, where x indicates the serial number of the element of the charge shift device, counting towards the input E, and y indicates the serial number of the capacitor element in an element again counting towards the input E (in the charge shift device 10, y assumes the values 1 and 2 although generally it assumes the values 1 to n). Correspondingly, in filter I, the nonreactive, amplifying outputs are referenced $K_{xy}$. Accordingly, for example, the output $K_{21}$ is the output provided in the capacitor element 21.

The signal values which have been evaluated with the amplification factors will now be generally represented in the form $K_{xy} \cdot s_{uv}$. The significance of xy has already been given. For $s_{uv}$, u signifies the serial index of the sampling times $t_1$, $t_2$ etc. (see FIG. 2), and v is a number from 1 to n, and additionally indicates sampling times between $t_u$ and $t_{u+1}$ when the filter I is operated with a pulse train frequency of $n \cdot f_0$. Only the situation $n=1$ is of significance for the following.

FIGS. 3 to 7 each illustrate a matrix-like scheme of the evaluated signals $K_{xy} s_{uv}$. In each diagram only the columns with $v=1$ are of significance. The columns with $v=2$ could be omitted. In each diagram the evaluated signal values $K_{xy} s_{uv}$ which are relevant to the output signal have each been surrounded by a circle. Specific circles are connected to one another by lines. This indicates that the values $K_{xy} s_{uv}$ in these circles connected by lines must be added in order to form the output signal.

Figure 3:
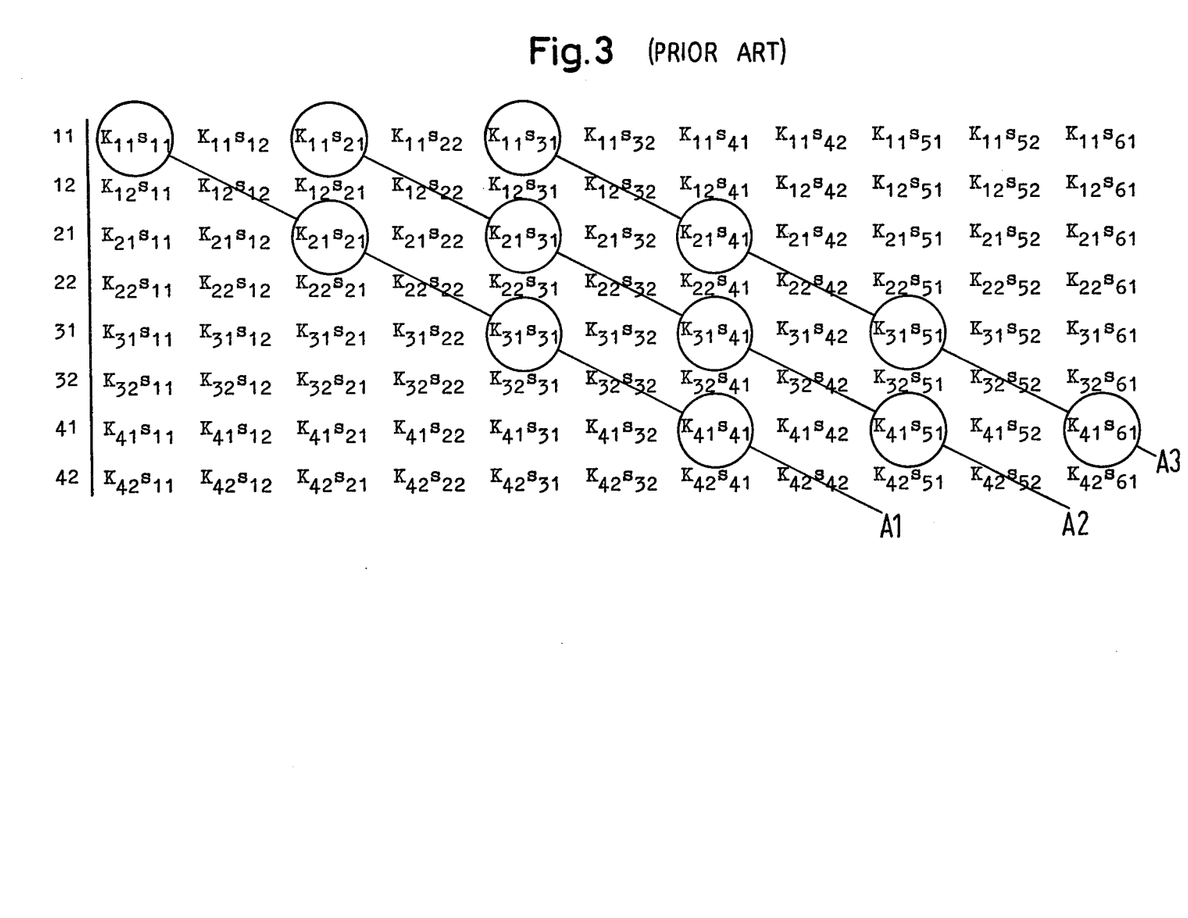
FIGS. 3 to 7 each illustrate a matrix-like plan.

The diagram in FIG. 3 relates to the filter I in FIG. 1. It has been assumed that the signal value $S_{11}$ input at the time $t_1$ has reached the capacitor element 11 in the charge shift device. The capacitor element 11 then contains the signal value $S_{21}$, the capacitor element 31 the value $S_{31}$, and the capacitor element 41 the signal value $S_{41}$. These signal values are read out from the charge shift device in parallel and the sum of the values $K_{11} \cdot s_{11}$, $K_{21} \cdot s_{21}$, $K_{31} \cdot s_{31}$ and $K_{41} \cdot s_{41}$ is obtained at the filter output A. In the diagram, each of these evaluated signal values is surrounded by a circle and these circles are connected to one another by lines which indicate that these evaluated signal values must be added for the signal formation. With the next pulse train, all these signal values are shifted towards the left by one capacitor element, whereby the capacitor element 11 now contains the signal value $S_{21}$, and the capacitor element 41 contains a newly added signal value $S_{51}$. Naturally the charge shift device must be provided with an output stage following the capacitor element in order that each signal value contained therein can be read out with the next pulse train. This also applies to the exemplary embodiments II and III of the invention. A suitable output stage is, for example, an electrode having an implanted barrier. The signal values $S_{21}$, $S_{31}$, $S_{41}$ and $S_{51}$ are again read out in parallel and the sum of $K_{11} \cdot s_{21}$, $K_{21} \cdot s_{31}$, $K_{31} \cdot s_{41}$ and $K_{41} \cdot s_{51}$ is available at the filter output A. This sum is again shown in the diagram in FIG. 3. By continuing the diagram along the same lines, all the signal values of the filtered signal can now be determined in a simple manner. In the diagram in FIG. 3, the first three signal values of the filtered signal are referenced $A_1$, $A_2$ and $A_3$. The output frequency $f_A$ with which the filtered signal is withdrawn is governed by $f_A = f_0$.

Figure 4:
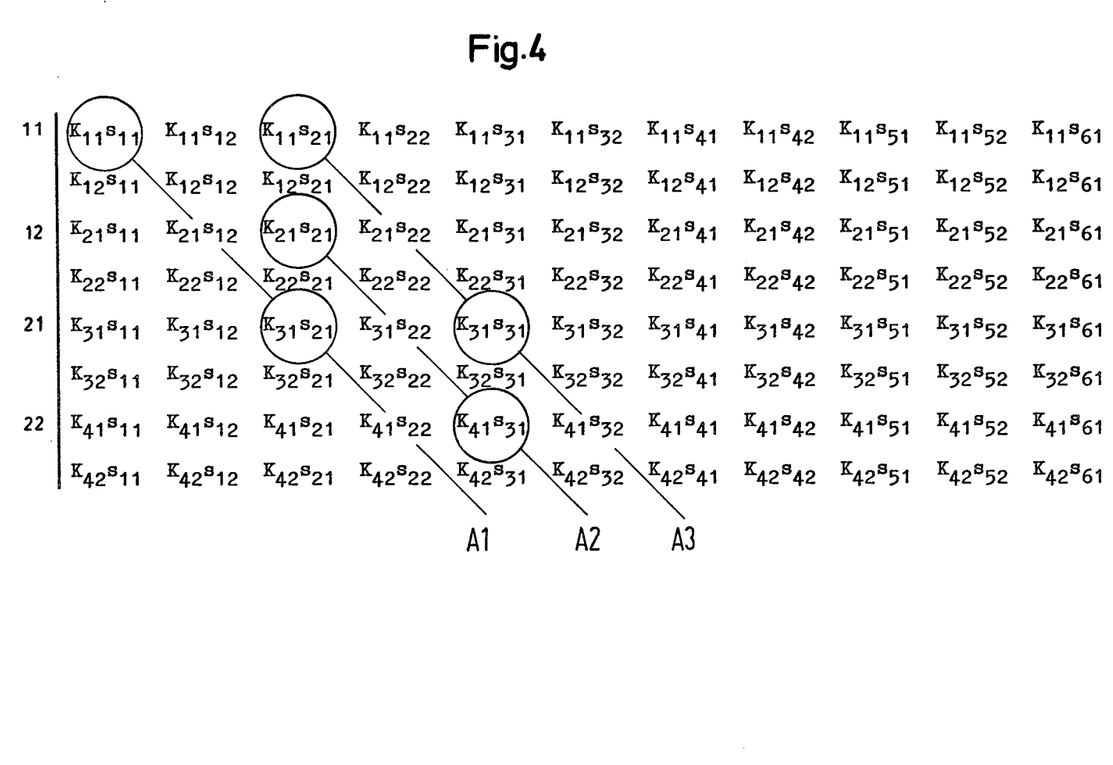

The diagram in FIG. 4 relates to the filter II in the case where $f_{II}=f_0$. If the signal value $S_{11}$ input at the input E at the time $t_1$ has been forwarded to the capacitor element 11, the capacitor element 31 contains the signal value $S_{21}$. Both signal values are read out in parallel and the value $A_1 = K_{11} \cdot s_{11} + K_{31} \cdot s_{21}$ of the filtered signal is available at the filter output A. These signal values are shifted towards the left by one capacitor element following half the pulse train time, whereby the capacitor element 12 contains the signal value $S_{21}$ and the capacitor element 22 contains a newly input signal value $S_{31}$. Both signal values are read out at this time and the value $A_2=K_{21}\cdot s_{21}+K_{41}\cdot s_{31}$ of the filtered signal is obtained at the filter output A. These two signal values are displaced towards the left by one capacitor element for the full pulse train period, and at this time the value $A_3=K_{11}\cdot s_{21}+K_{31}\cdot s_{31}$ of the filtered signal etc. is obtained at the output A. Here the output frequency $f_A$ is governed by $f_A=2f_0$, whereas the sampling frequency $f_E$, with which the signal to be filtered is sampled, is governed by $f_E=f_0$.

Figure 5:
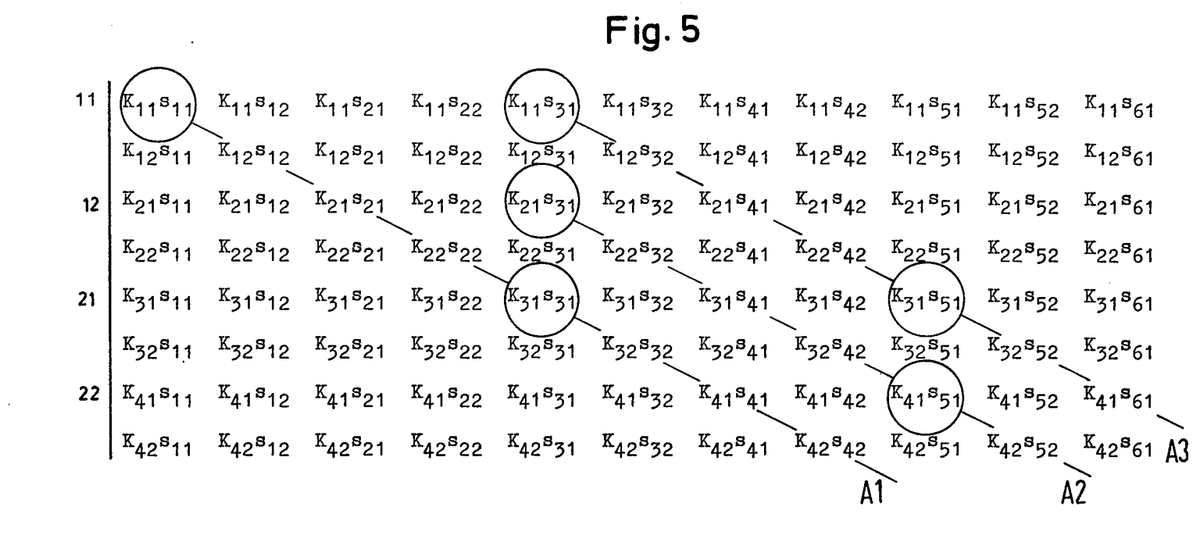

The diagram in FIG. 5 likewise applies to the filter II, although now in the event in which $f_{II}=f_0/2$. If the signal value $S_{11}$ input at the input E at the time $t_1$ has been forwarded to the capacitor element 11, the capacitor element 31 now contains the value $S_{31}$ since now sampling is carried out only following every second instant of time. At this time the value $A_1=K_{11}\cdot s_{11}+K_{31}\cdot s_{31}$ of the filtered signal is obtained at the filter output A. Following the time $T_0=1/f_0$, a shift by one capacitor element towards the left has occured, as a result of which the value $A_2=K_{21}\cdot s_{31}+K_{41}\cdot s_{51}$ is present at the output A at this time. Now the output frequency $f_A$ is $f_A=f_0$, whereas the sampling frequency $f_E=f_0/2$.

Figure 6:
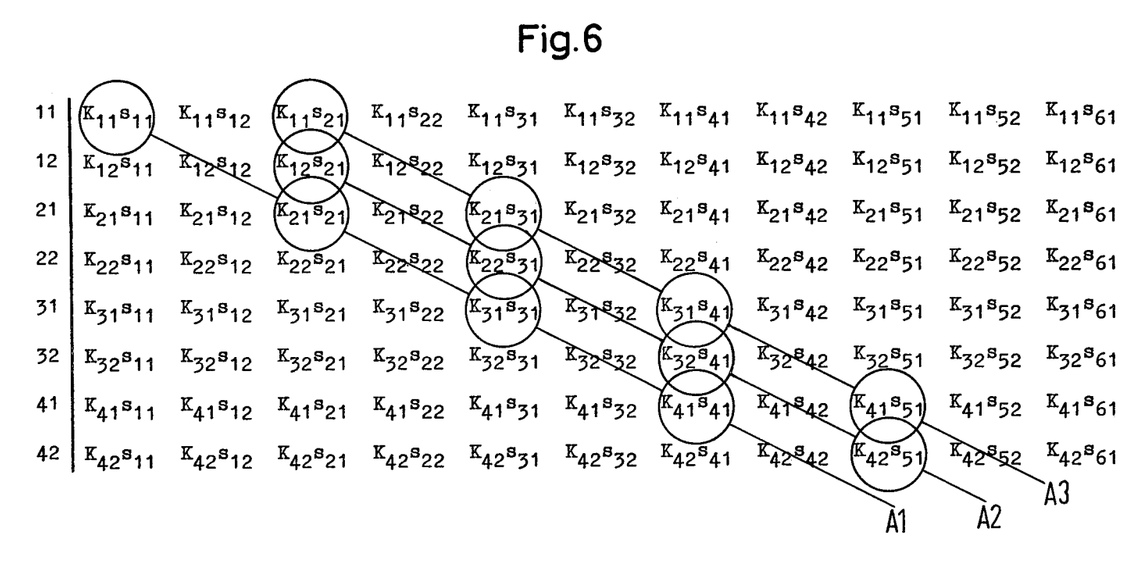

The diagram in FIG. 6 relates to the filter III in the event that $f_{III}=f_0$. The diagram illustrates the formation of the signal values of the output signal for the first three signal values $A_1$, $A_2$ and $A_3$. The following signal values can easily be determined by continuing the diagram accordingly. Here $f_A=2f_0$ and $f_E=f_0$.

Figure 7:
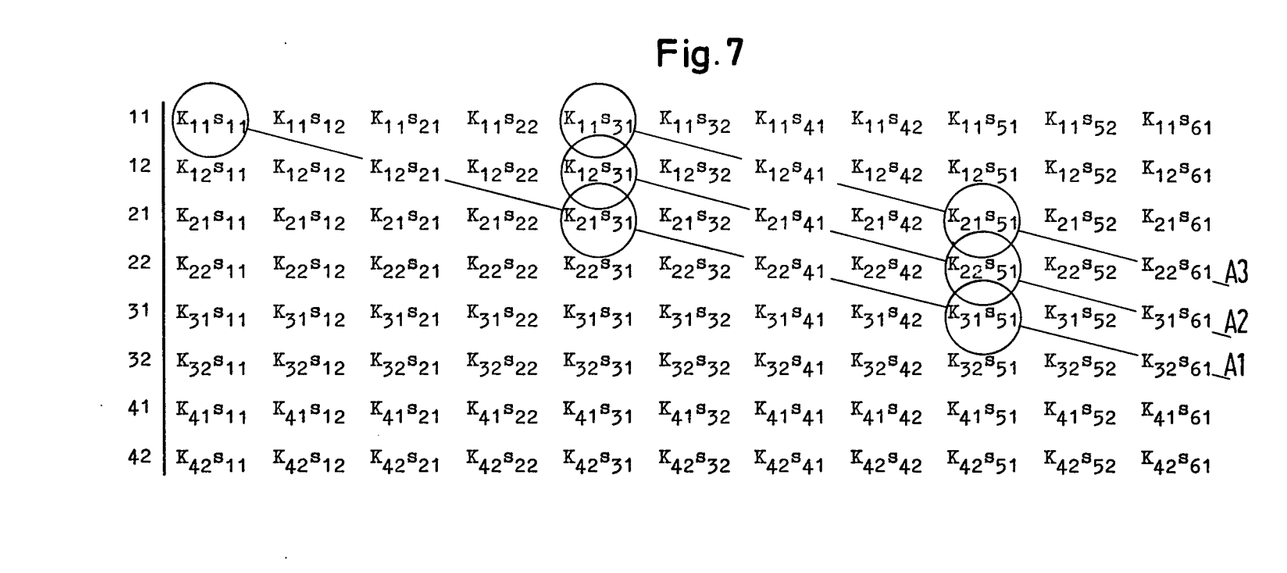

The diagram in FIG. 7 likewise applies to filter III, but in the case when $f_{III}=f_0/2$. Again the formation of the first three signal values $A_1$, $A_2$ and $A_3$ can be gathered from the diagram. By continuing the diagram accordingly it is easily possible to determine all the following signal values of the filtered signal. In this case $f_A=f_0$ and $f_E=f_0/2$.

Figure 8:
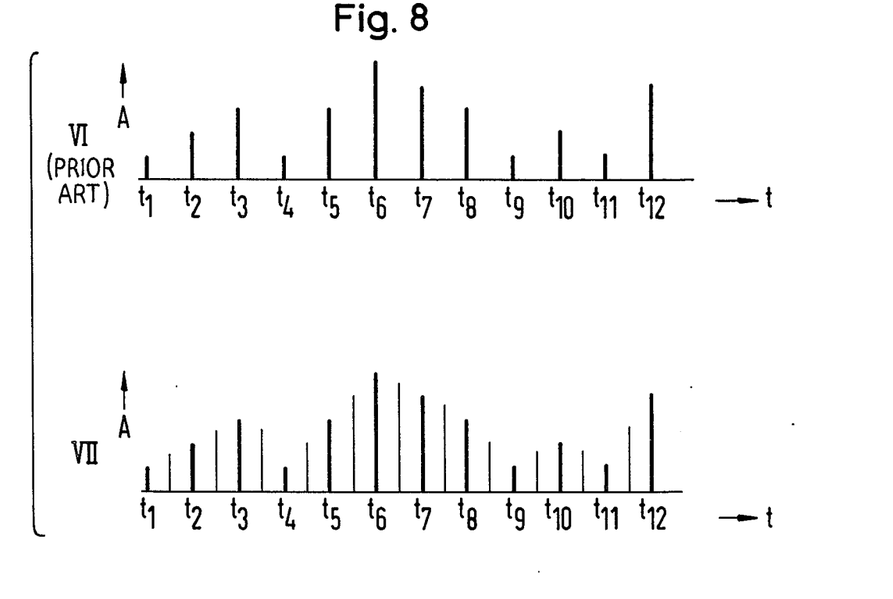
FIG. 8 shows, in two diagrams VI and VII, the output signals of a conventional transversal filter in comparison to the output signal of an exemplary embodiment of the invention, plotted over time t.

In FIG. 8, diagram VI illustrates an example of a filtered signal as is withdrawn from the filter output A of the filter I in FIG. 1 during operation with the pulse train frequency $f_0$. By way of comparison, diagram VII illustrates the output signal at the filter output A of the filter III in FIG. 1 for the same input signal, this filter being operated with the pulse train frequency $f_{III}=f_0$. It can clearly be seen that a smoothing of the filtered signal is achieved with filter III in comparison to filter 1. The information appears with double (n times) the frequency. This filtered signal per se no longer contains information as the output signal of the filter I, and is merely represented in a more favorable form, thus simplifying further processing. Thus, smoothing with an RC element can be sufficient to enable the signal to be represented in the base band, i.e. to eliminate the higher frequency components contained in the sampling signal.

In the two exemplary embodiments, all the capacitor elements are provided with non-reactive, parallel outputs. It should be noted that this is not required. In order to achieve new filter properties for the filter I, it is sufficient for at least one of the other capacitor elements to possess a non-reactive, amplifying output. In many embodiments, and likewise the described embodiments, the amplification factor of this output corresponds to an assigned value of the pulse response of the filter function.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A transversal filter with a charge coupled device (CCD) for realizing a filter function, comprising: a substrate comprised of doped semiconductor material having arranged on one surface thereof a series of capacitors each comprising a surface electrode and the substrate below each surface electrode as a counter electrode; each surface electrode being spaced from said surface by an insulating layer; at least three shift pulse lines supplying shift pulses displaced in phase relative to one another; said at least three shift pulse lines being respectively connected to at least first, second, and third groups of surface electrodes, a serial input means at one end of the CCD for connection to a signal to be filtered; the surface electrodes from the first group each having a non-reactive amplifying output means connected thereto; the amplifying output means also connecting to a filter output from which a filtered signal can be obtained; an amplification factor of each of said amplifying outputs corresponding to an assigned value of a pulse response of the filter function to be realized by the filter; and at least one of the surface electrodes from the second group and at least one of the surface electrodes from the third group each having an additional non-reactive amplifying output means provided therefore which is connected to the filter output.

2. A transversal filter as claimed in claim 1, characterized in that an amplification factor of said additional amplifying output means likewise corresponds to an assigned value of the pulse response of the filter function.

* * * * *